Sept. 15, 1964 P. H. WINTER ETAL 3,148,438

METHOD OF MAKING WIRING BOARDS

Filed April 25, 1960

INVENTORS

Peter Heron Winter

Terence Fitzpatrick

By Watson, Cole, Grindle & Watson 3,148,438

METHOD OF MAKING WIRING BOARDS

Peter Heron Winter, Lymington, and Terence Fitzpatrick, East Cowes, Isle-of-Wight, England, assignors to Vero Precision Engineering Limited, Southampton, Hampshire, England, a British company Filed Apr. 25, 1960, Ser. No. 24,422
Claims priority, application Great Britain May 25, 1959
4 Claims. (Cl. 29—155.5)

Wiring boards employing printed circuits are usually designed to suit a particular circuit and can be used for that circuit alone or very simple variations of it. The layout of a circuit suitable for printing is complex and often involves a considerable amount of trial and error design which renders the printed circuit technique economic for large scale production only. To accommodate the components on a printed circuit board a large number of holes has to be drilled in the board, usually in an irregular pattern requiring special drilling machines or templates.

The present invention provides a wiring board which can be used to provide a variety of different circuits. According to the invention an insulating board is provided with a regular pattern of strips of copper or other electrically conducting material bonded to the board and is perforated by a multiplicity of regularly distributed holes which extend at spaced intervals through the conducting strips. After the terminals of the circuit components have been inserted through the appropriate holes in the board the conducting strips are interrupted where necessary to establish the required circuit. Alternatively the strips may be interrupted prior to insertion of the terminals into the holes.

Thus the board may be provided on one surface with a series of parallel strips of copper, and formed with holes arranged in a grid at regular pitch and extending through each of the copper strips. In this example the circuit components are mounted on the board on the opposite side to the copper strips with their terminals passing through the appropriate holes and soldered to the copper strips. The copper strips are interrupted where necessary by removing the copper, for example with a spot-face cutter.

The use of such a regular grid facilitates the layout of any particular circuit and in many cases allows the layout of the most complicated circuits to be determined by mathematical methods. The use of standard modules for the spacing of the holes and copper strips greatly facilitates the preparation and fitting of components and connectors. Special jigs, drilling machines and punches such as are required for making the holes in printed circuit boards, are eliminated. Very simple templates can be used for interrupting the copper strips. For example spot-face cutters can be employed with a simple template formed with appropriately spaced holes indicating the cutter location. The number of interruptions necessary has been found to be very small in a normal circuit.

Copper strips may be provided on both sides of the board if desired and components may be mounted on either side.

One specific embodiment of wiring board according to the invention will now be described in more detail, by way of example, with reference to the accompanying drawing, in which.

Figure 1:
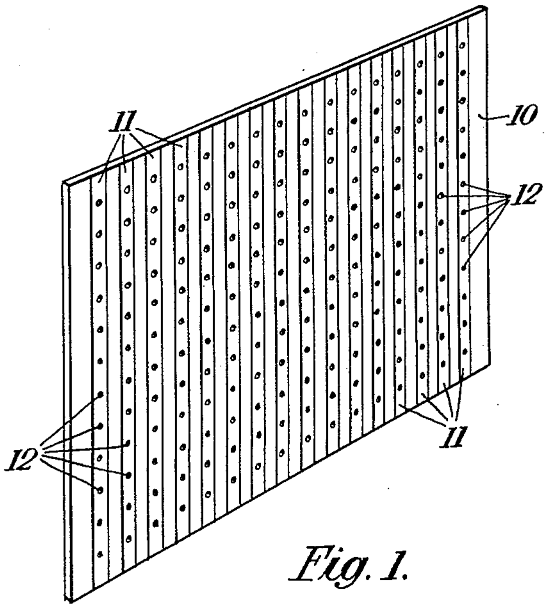
FIG. 1 is a perspective view of the wiring board.
Figure 2:
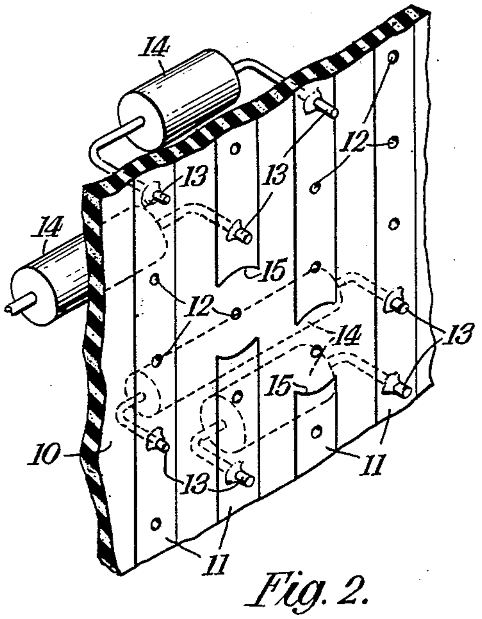
FIG. 2 is a view on a larger scale of part of the board with circuit components fitted thereto.

The wiring board consists of a panel 10 of insulating material to which are bonded parallel equally spaced strips 11 of copper. The board is preferably made by bonding a sheet of copper or other electrically conducting material to the panel 10 and thereafter removing unwanted portions of the copper sheet by mechanical means to leave the required pattern of conducting strips 11 on the board. Thus the unwanted copper may be removed by the use of a slotted milling cutter. As an alternative other mechanical methods of removal may be used, e.g. planning, shaping, routing, or scraping.

As a further alternative the required conducting pattern may be provided on the board by bonding to the panel individual strips of copper or the like, in which case there is no necessity for subsequent removal of copper from the board. As a further alternative the copper strips 11 may be applied to the panel 10 by any desired printed circuit technique.

The board is provided with a series of through holes 12 of uniform size arranged at regular spacing in a grid, the holes extending through the strips 11 as shown.

The required circuit is constructed by inserting the terminals 13 of circuit components 14 through the appropriate holes 12 in the board and soldering the terminals to the copper strips 11. The strips 11 are then interrupted where necessary, as indicated at 15, by removing the copper by means of a spot-face cutter.

What we claim as our invention and desire to secure by Letters Patent is:

1. A method of establishing an electrical circuit between circuit components, which includes the steps of forming on at least one surface of a panel of electrically insulating material a pattern of adherent, equally spaced straight parallel strips of electrically conductive material which are electrically insulated from each other, piercing the panel with a multiplicity of regularly distributed holes arranged in a grid pattern, said holes intersecting each of said strips at a multiplicity of equally spaced points, inserting terminals of said circuit components through desired pairs of said holes, the holes in each pair extending through different strips, soldering said terminals to said strips to establish electrical contact between said terminals and said strips, locating at least one hole position defining a predetermined circuit interruption path in said grid pattern, centering a cutting tool in the last said hole for precisely locating the desired area of strip removal, and superficially removing the electrically conductive material of the strip about said hole from said panel with said cutting tool to break the electrical connection between terminals of adjoining components and thereby to provide the desired electrical circuit between said components.

2. A method according to claim 1, wherein said portions of said strips are removed after said terminals have been inserted in said holes.

3. A method of establishing an electrical circuit between circuit components which includes the steps of forming on at least one surface of a panel of electrically insulating material a pattern of adherent, equally spaced, straight parallel strips of electrically conductive material which are electrically insulated from each other, piercing the panel with a multiplicity of regularly distributed holes arranged in a grid pattern, said holes intersecting each of said strips at a multiplicity of equally spaced points, inserting terminals of said circuit components through desired pairs of said holes, the holes in each pair extending through different strips, soldering said terminals to said strips to establish electrical contact between said terminals and said strips, locating at least one hole position defining a predetermined circuit interruption path in said grid pattern, centering a spot-face cutter in the last said hole, and superficially removing the electrically conductive material of the strip about said hole from said panel by said spot-face cutter to break the electrical connection between terminals of adjoining components and thereby providing the desired electrical circuits between said components.

4. A method of establishing an electrical circuit between circuit components on a printed circuit board comprising a sheet of electrically conducting material bonded to the surface of a panel of electrically insulating material wherein portions of the conducting material are removed from said sheet to leave thereon a pattern of adherent parallel strips of electrically conductive material which are electrically insulated from each other, comprising the steps of, piercing the panel with a multiplicity of regularly distributed holes arranged throughout the panel in a grid pattern, said holes intersecting each of said strips at a multiplicity of spaced points, inserting terminals of said circuit components through only a portion of the available pairs of said holes, the holes in each pair extending through different strips, soldering said terminals to said strips to establish electrical contact between said terminals and said strips, locating by its unique position within said grid pattern at least one hole position defining a predetermined circuit interruption path for solating said circuit components, positioning a tool by referencing in said located hole, and operating the tool while positioned in said hole to remove portions of said strips from said panel to break the electrical connection between terminals of adjoining components thereby providing electrical circuits including said components.

References Cited in the file of this patent

UNITED STATES PATENTS

| | | |
|---|---|---|
| 1,794,831 | Caruso | Mar. 3, 1931 |
| 2,399,753 | McLarn | May 7, 1946 |
| 2,433,384 | McLarn | Dec. 30, 1947 |
| 2,502,291 | Taylor | Mar. 28, 1950 |
| 2,651,833 | Kernahan | Sept. 15, 1953 |
| 2,889,532 | Slack | June 2, 1959 |
| 2,914,706 | Hill et al. | Nov. 24, 1959 |
| 2,932,772 | Bowman et al. | Apr. 12, 1960 |
| 2,937,358 | Bulger | May 17, 1960 |
| 2,985,709 | Mammola | May 23, 1961 |
| 3,033,914 | Alfonso Acosta-Lleras | May 8, 1962 |

OTHER REFERENCES

New Advances in Printed Circuits, National Bureau of Standards Miscellaneous Publication 192, Nov. 22, 1948 (pages 48–49).